(12) United States Patent
Park

(10) Patent No.: US 7,563,626 B2
(45) Date of Patent: Jul. 21, 2009

(54) MANUFACTURING METHOD OF COMPLEMENTARY METAL OXIDE SILICON IMAGE SENSOR

(75) Inventor: Kyung-Min Park, Inchoen (KR)

(73) Assignee: Dongbu HiTek Co., Ltd., Seoul (KR)

( * ) Notice: Subject to any disclaimer, the term of this patent is extended or adjusted under 35 U.S.C. 154(b) by 118 days.

(21) Appl. No.: 11/857,201

(22) Filed: Sep. 18, 2007

(65) Prior Publication Data

US 2008/0079042 A1    Apr. 3, 2008

(30) Foreign Application Priority Data

Sep. 28, 2006   (KR)   ............... 10-2006-0094638

(51) Int. Cl.
*H01L 21/00* (2006.01)
(52) U.S. Cl. ............... 438/29; 438/7; 438/34; 438/104; 257/89; 257/98; 257/E21.527
(58) Field of Classification Search ......... 438/576, 438/599
See application file for complete search history.

(56) References Cited

U.S. PATENT DOCUMENTS

2007/0161146 A1*   7/2007   Lee ............................ 438/70
2008/0090323 A1*   4/2008   Wu ............................. 438/70

\* cited by examiner

*Primary Examiner*—Walter L Lindsay, Jr.
*Assistant Examiner*—Cheung Lee
(74) *Attorney, Agent, or Firm*—Sherr & Vaughn, PLLC

(57) ABSTRACT

A manufacturing method of a CMOS image sensor including at least one of the following steps. Forming an under-structure including a photodiode, a metal wire, and an interlayer insulation film for insulation between a metal pad and the metal wire. Forming a passivation layer on and/or over the under-structure. Selectively etching the passivation layer and the interlayer insulation film below the passivation layer to form a color filter region and a metal pad exposure region. Simultaneously etching the color filter region and the metal pad exposure region. Sequentially forming a plurality of color filters and a plurality of micro lenses on the interlayer insulation film etched to form the color filters.

20 Claims, 2 Drawing Sheets

MANUFACTURING METHOD OF COMPLEMENTARY METAL OXIDE SILICON IMAGE SENSOR

This application priority under 35 U.S.C. 119 to Korean Patent Application No. 10-2006-0094638 (filed on Sep. 28, 2006), which is hereby incorporated by reference in its entirety.

BACKGROUND

An image sensor is a semiconductor device used to convert optical images to electric signals. Image sensors may be classified as a charge coupled device (CCD) and a complementary metal oxide semiconductor (CMOS).

A CCD image sensor stores electric charge carriers and transferred from metal oxide silicon (MOS) capacitors.

A CMOS image sensor may be provided with a plurality of unit pixels whereby each unit pixel includes one light sensing device such as a photodiode and a plurality of MOS transistors. The CMOS image sensor may be formed using CMOS technology and may include a control circuit and a signal processing circuit as peripheral circuits. Moreover, red, green and blue optical signals may be sequentially detected by the MOS transistors, and outputted using a switching method.

The CMOS image sensor may offer several advantages such as low power consumption, low manufacturing cost, and high degree of integration.

The CMOS image sensor may include an optical detection unit for detecting light and a logic circuit unit for processing the detected light into an electric signal as data. Attempts have been carried out to increase the ratio (i.e., fill factor) in area between the optical detection unit and the image sensor, which in turn, may increase the optical sensitivity of the device. It may not be fundamentally possible, however, to remove the logic circuit unit, and thus, such attempts are limited in the restricted area.

In order to increase the optical sensitivity, a method of forming and using micro lenses has been proposed which uses a light collector for changing the route of light incident on other regions excluding the optical detection unit, such that light is collected in the optical detection unit. Additionally, an image sensor for detecting a color image may be fabricated such that color filters can be sequentially arranged in an array on the optical detection unit. The color filter array (CFA) may include three color filters from the group of red, green, blue, yellow, magenta and cyan. In addition, micro lenses may be formed on the color filter array to increase the optical sensitivity of the image sensor.

Figure 1:
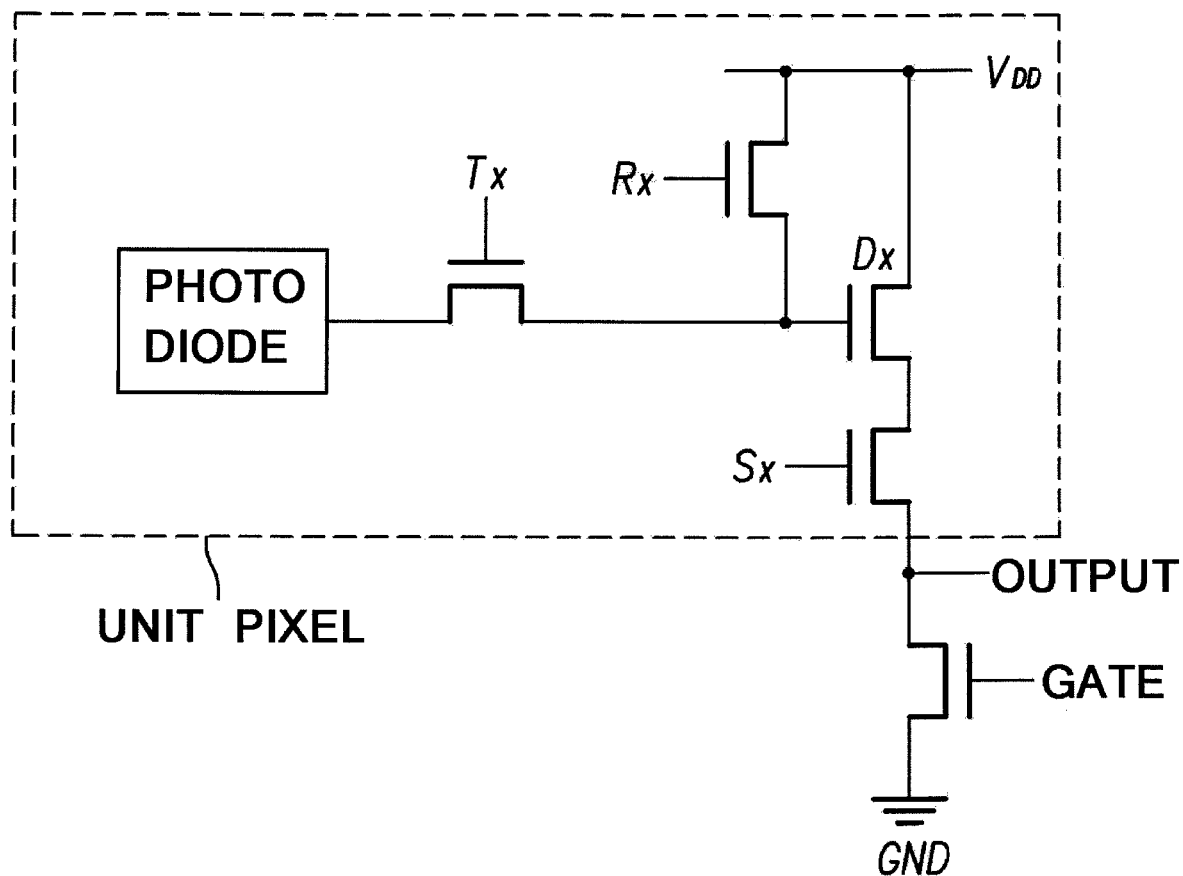

As illustrated in example FIG. 1, a unit pixel of a 4-T CMOS image sensor may include a photodiode (PD) for detecting an optical signal and four n-channel metal oxide semiconductor (NMOS) transistors. The four transistors may include transfer transistor Tx, reset transistor Rx, drive transistor Dx and select transistor Sx. Transfer transistor Tx transmits optical charges generated by the photodiode (PD) to a floating sensing node. Reset transistor Rx discharges the optical charges stored in the floating sensing node for signal detection. Drive transistor Dx acts as a source follower while select transistor Sx performs switching and addressing functions. VDD is drive source voltage and DC gate is a load transistor that may apply uniform voltage to a gate potential of the transistor such that uniform current flows.

SUMMARY

Embodiments relate to a method of manufacturing a complementary metal oxide silicon (CMOS) image sensor including simultaneously etching a region a color filter region and an exposed upper surface of a metal pad. Such an arrangement is advantageous for reducing overall manufacturing costs and manufacturing time.

In accordance with embodiments, a method of manufacturing a CMOS image sensor may include at least one of the following steps. Forming an under-structure including a photodiode, a metal wire, and an interlayer insulation film for insulation between a metal pad and the metal wire. Forming a passivation layer on and/or over the under-structure. Selectively etching the passivation layer and the interlayer insulation film below the passivation layer to form a color filter region and a metal pad exposure region. Simultaneously etching the color filter region and the metal pad exposure region. Sequentially forming a plurality of color filters and a plurality of micro lenses on the interlayer insulation film etched to form the color filters.

DRAWINGS

Example FIG. 1 illustrates a unit pixel of a 4-T CMOS image sensor.

Figure 2A:
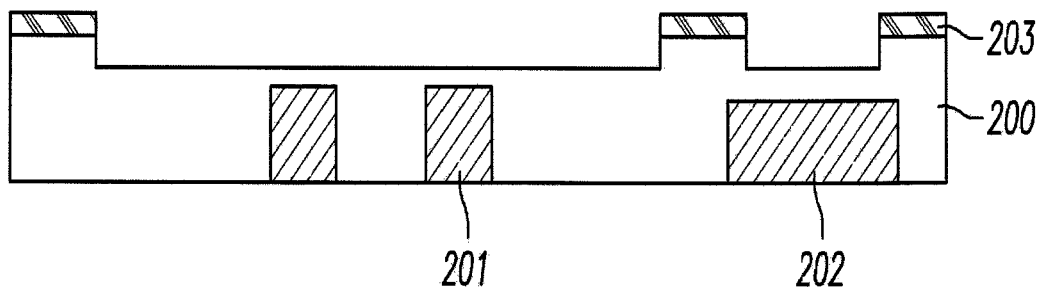
Figure 2B:
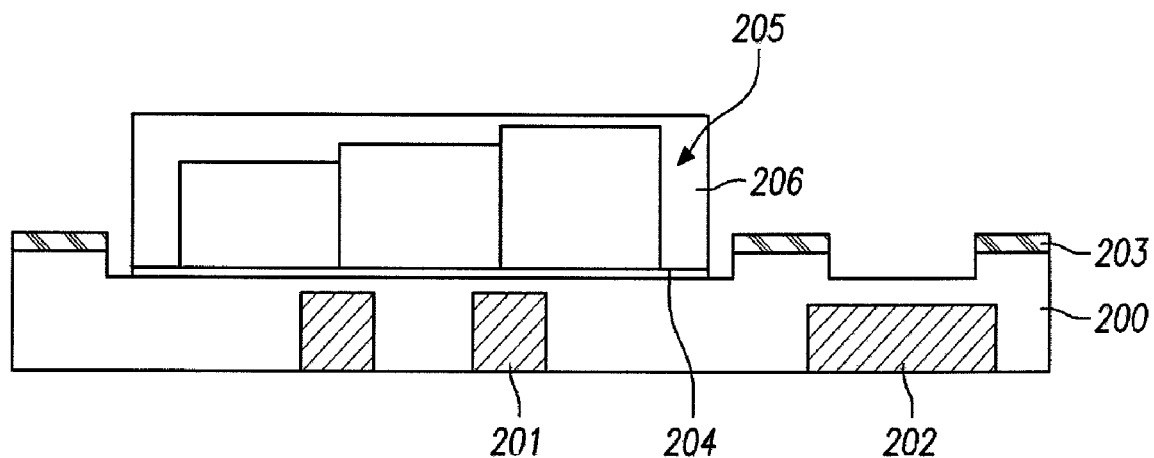
Figure 2C:
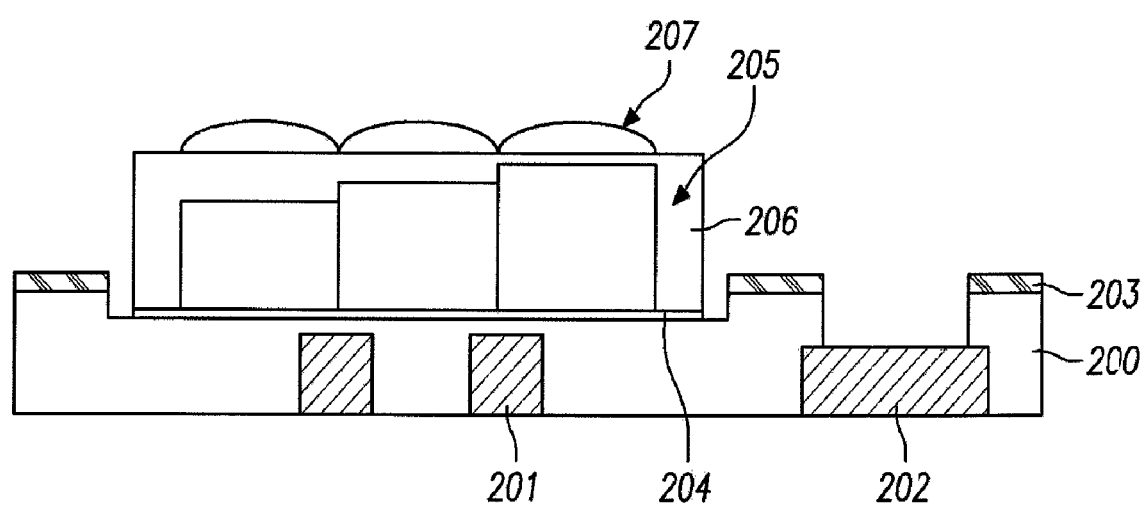

Example FIGS. 2A to 2C illustrate a manufacturing method of a CMOS image sensor, in accordance with embodiments.

DESCRIPTION

As illustrated in example FIG. 2A, an under-structure, including a photodiode for receiving incident light to accumulate electric charges, metal wire 201 constituting a unit pixel, interlayer insulation film 200 for providing insulation between a metal pad 202 for connecting a bonding wire and the metal wire 201, is formed. Passivation layer 203 having a predetermined thickness may be deposited on and/or over the under-structure. Interlayer insulation film 200 may be composed of undoped silicate glass (USG). Passivation layer 203 may be composed of silicon nitride (SiN).

As illustrated in example FIG. 2B, interlayer insulation film 200 and passivation layer 203 can be selectively etched to form a color filter region, i.e., a region where color filters 205 will be formed and a metal pad exposure region, i.e., a region where the top surface of metal pad 202 will be exposed. Subsequently, the color filter region and the metal pad exposure region are simultaneously etched. Passivation layer 203 may at this time be completely etched. Interlayer insulation film 200 may be etched below passivation layer 203, i.e., the portion of interlayer insulation film 200 lying on and/or over metal pad 202 may be etched to a thickness of between approximately 100 to 300 Å. The portion of interlayer insulation film 200 remaining on and/or over metal pad 202 may serve as a protection layer for protecting metal pad 202 when subsequent processes for forming color filters and micro lenses are performed. Accordingly, corrosion of metal pad 202 is prevented.

The simultaneous etching of the color filter region and the metal pad exposure region may serve to reduce the overall number of masks used during the manufacturing process, especially when compared to the use of separate etching processes. This is beneficial in terms of reducing both manufacturing process costs and time.

The use of silicon nitride (SiN) as passivation layer 203 can be beneficial in reducing light sensitivity. Accordingly, once interlayer insulation film 200 is exposed to form color filter region and metal pad exposure region, the reflection of the silicon nitride can be lowered during the etching of passivation layer 203, which enhances the sensitivity. In accordance with embodiments, the method of manufacturing a CMOS image sensor can be applicable for high-integrated devices, thereby creating the possibility of obtaining enhanced sensitivity through the reduction of a focal length while also reducing or otherwise eliminating crosstalk.

Planarization layer 204 can be formed on and/or over interlayer insulation film 200. Planarization layer 204 can be etched such that interlayer insulation film 200 has a predetermined thickness, so as to form color filters 205 thereon and/or thereover. Color filters 205 including a first color filter, a second color filter, and a third color filter, can be formed on and/or over planarization layer 204. Color filters 205 may include red, green, and blue. A single color filter 205 can be formed for each unit pixel so as to separate color from incident light. Also, adjacent color filters 205 can partially overlap with each other. The height difference between color filters 205 can be caused by the overlapping between color filters 205. Consequently, overcoat layer 206 can be formed on and/or over color filters 205 so as to overcome the height difference between color filters 205. Thereby, a plurality of micro lenses 207 can be uniformly manufactured and focal length may be controlled.

As illustrated in example FIG. 2C, a plurality of micro lenses 207 can be formed on and/or over overcoat layer 206 such that the micro lenses correspond to color filters 205. Micro lenses 207 may be formed in a convex shape using a predetermined process, such as flow. After formation of micro lenses 207, the portion of interlayer insulation film 200 remaining on and/or over metal pad 202 may be removed by bulk etching in order to expose at least a portion of the upper surface of metal pad 202.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
  forming an under-structure including a photodiode, a metal wire, and an interlayer insulation film for providing insulation between a metal pad and the metal wire;
  forming a passivation layer over the under-structure;
  selectively etching the passivation layer and the interlayer insulation film to form a color filter region and a metal pad exposure region;
  simultaneously etching the color filter region and the metal pad exposure region; and
  sequentially forming a plurality of color filters and a plurality of micro lenses over the interlayer insulation film.

2. The method of claim 1, further comprising:
  forming an overcoat layer over the plurality of color filters after forming the plurality of color filters and before forming the plurality of micro lenses.

3. The method of claim 2, wherein the step of forming the plurality of color filters, the over coating layer, and the plurality of micro lenses comprises:
  forming a planarization layer over color filter region;
  forming the plurality of color filters over the planarization layer, said plurality of color filters including a red color filter, a green color filter, and a blue color filter,
  forming the overcoat layer over the plurality of color filters, and
  forming the plurality of micro lenses over the overcoat layer such that the plurality of micro lenses correspond to the plurality of color filters.

4. The method of claim 2, wherein the interlayer insulation film comprises undoped silicate glass.

5. The method of claim 1, wherein simultaneously etching the color filter region and the metal pad exposure region comprises:
  completely etching the passivation layer, and
  etching a portion of the interlayer insulation film over the metal pad to a thickness of between approximately 100 to 300 Å.

6. The method of claim 5, further comprising:
  etching the portion of the interlayer insulation film over the metal pad until at least a portion of the upper surface of metal pad is exposed.

7. The method of claim 1, wherein the passivation layer comprises silicon nitride.

8. An apparatus comprising:
  an under-structure including a photodiode, a metal wire, and an interlayer insulation film for providing insulation between a metal pad and the metal wire, wherein at least a portion of the upper surface of the metal pad is exposed;
  a passivation layer formed over the under-structure;
  a color filter region;
  a plurality of color filters formed in the color filter region; and
  a plurality of micro lenses formed over plurality of color filters and corresponding to the plurality of color filters.

9. The apparatus of claim 8, further comprising an overcoat layer formed between the plurality of color filters and the plurality of micro lenses.

10. The apparatus of claim 8, further comprising a planarization layer formed at the color filter region between the plurality of color filters and the interlayer insulating layer.

11. The apparatus of claim 8, wherein the passivation layer comprises silicon nitride.

12. The method of claim 8, wherein the interlayer insulation film comprises undoped silicate glass.

13. A method comprising:
  forming an under-structure including a photodiode, a metal wire, an interlayer insulation film, and a metal pad;
  forming a passivation layer over the under-structure;
  etching the interlayer insulation film and the passivation layer to form a color filter region and a metal pad exposure region;
  simultaneously etching the color filter region and the metal pad exposure region;
  forming a plurality of color filters in the color filter region;
  forming a overcoat layer over the plurality of color filters;
  forming a plurality of micro lenses over the overcoat layer;
  exposing at least a portion of the upper surface of the metal pad by etching the metal pad exposure region of the interlayer insulation film.

14. The method of claim 13, wherein the metal pad exposure region of the interlayer insulation film is etched to a thickness of between approximately 100 to 300 Å.

15. The method of claim 13, wherein the interlayer insulation film comprises undoped silicate glass.

16. The method of claim 13, wherein the passivation layer comprises silicon nitride.

17. The method of claim 13, wherein the plurality of color filters comprise a red color filter, a green color filter and a blue color filter.

18. The method of claim 13, wherein adjacent color filters partially overlap with each other.

19. The method of claim 13, wherein each one of the color filters has a different height as the others.

20. The method of claim 13, further comprising forming a planarization layer at the color filter region between the plurality of color filters and the interlayer insulating layer.

* * * * *